(12) United States Patent
Bowers

(10) Patent No.: US 6,223,147 B1
(45) Date of Patent: Apr. 24, 2001

(54) MULTIPLE USE CHIP SOCKET FOR INTEGRATED CIRCUITS AND THE LIKE

(75) Inventor: Richard Bowers, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 08/040,528

(22) Filed: Mar. 31, 1993

(51) Int. Cl.$^7$ .................. G06F 3/00; G06F 13/10
(52) U.S. Cl. .................. 703/25; 703/21; 703/28
(58) Field of Search .................. 364/489, 490, 364/200, 578; 371/25; 365/189, 196, 104; 395/375, 575, 500, 800; 703/25, 27, 28, 21

(56) References Cited

U.S. PATENT DOCUMENTS

| | | | |
|---|---|---|---|
| 4,319,343 | * | 3/1982 | Powell .................. 365/189 |
| 4,507,576 | * | 3/1985 | McCracken et al. .................. 307/475 |
| 4,539,517 | * | 9/1985 | Flora .................. 324/73 R |
| 4,544,882 | * | 10/1985 | Flora .................. 324/73 R |
| 4,633,417 | * | 12/1986 | Wilburn et al. .................. 364/550 |
| 4,674,007 | * | 6/1987 | Tragen .................. 361/404 |
| 4,768,195 | * | 8/1988 | Stoner et al. .................. 371/25 |
| 4,847,805 | * | 7/1989 | Ishii et al. .................. 364/900 |
| 4,901,259 | * | 2/1990 | Watkins .................. 364/578 |
| 5,099,516 | * | 3/1992 | Durkin et al. .................. 380/4 |
| 5,172,330 | * | 12/1992 | Watanabe et al. .................. 364/490 |
| 5,307,285 | * | 4/1994 | Storandt et al. .................. 364/489 |
| 5,325,490 | * | 6/1994 | Brasseur .................. 395/325 |
| 5,546,563 | * | 8/1996 | Chuang .................. 395/500 |

* cited by examiner

Primary Examiner—Kevin J. Teska
Assistant Examiner—Thai Phan
(74) Attorney, Agent, or Firm—Blakely, Sokoloff, Taylor & Zafman LLP

(57) ABSTRACT

A multiple use chip socket supporting more than one type of permanent storage chip in a single chip socket is disclosed. The multiple use chip socket provides a plurality of address bit lines which are used to specify an address of a particular location within a memory device installed in the socket. In general, the number of address bit lines directly coupled to the socket correspond to the number of address bit lines required for the smallest memory device to be installed in the socket. Additional address bit lines are coupled to control logic of the present invention. The control logic selectively applies addressing signals to the chip socket depending on the type of memory device inserted in the socket. As part of the initialization process, the processing logic of the present invention first determines if an access to a device installed in the chip socket is required by a circuit board as part of its initialization or boot process. If such an access is required, the processing logic then determines if a device is installed in the chip socket. If a device is installed in the chip socket, the processing logic then determines if the device is a flash device or an EPROM device or other type of device. In this manner, the accessing signals appropriate for the particular type of device can be configured.

18 Claims, 7 Drawing Sheets

FIGURE 2

| Left | Pin | | Pin | Right |
|---|---|---|---|---|
| N.C. | 1 | | 32 | N.C. |
| N.C. | 2 | | 31 | N.C. |
| VPP | 3 | | 30 | VCC |
| A12 | 4 | | 29 | $\overline{PGM}$ |
| A7 | 5 | | 28 | N.C. |
| A6 | 6 | | 27 | A8 |
| A5 | 7 | | 26 | A9 |
| A4 | 8 | | 25 | A11 |
| A3 | 9 | | 24 | $\overline{OE}$ |
| A2 | 10 | | 23 | A10 |
| A1 | 11 | | 22 | $\overline{CE}$ |
| A0 | 12 | | 21 | D7 |
| D0 | 13 | | 20 | D6 |
| D1 | 14 | | 19 | D5 |
| D2 | 15 | | 18 | D4 |
| GND | 16 | | 17 | D3 |

SOCKET PINOUTS WITH EPROM INSTALLED -210-

FIGURE 3

| Pin | Signal | | Pin | Signal |
|---|---|---|---|---|
| 1 | VPP | | 32 | VCC |
| 2 | A16 | | 31 | WE̅ |
| 3 | A15 | | 30 | A17 |
| 4 | A12 | | 29 | A14 |
| 5 | A7 | | 28 | A13 |
| 6 | A6 | | 27 | A8 |
| 7 | A5 | | 26 | A9 |
| 8 | A4 | | 25 | A11 |
| 9 | A3 | | 24 | O̅E̅ |
| 10 | A2 | | 23 | A10 |
| 11 | A1 | | 22 | C̅E̅ |
| 12 | A0 | | 21 | D7 |
| 13 | D0 | | 20 | D6 |
| 14 | D1 | | 19 | D5 |
| 15 | D2 | | 18 | D4 |
| 16 | VSS | | 17 | D3 |

SOCKET PINOUTS WITH FLASH MEMORY INSTALLED -310-

FIGURE 4

| SOCKET PIN | EPROM SIGNAL | FLASH MEMORY SIGNAL | SIGNALS REQUIRING SPECIAL PROCESSING |
|---|---|---|---|
| 1 | N.C. | Vpp | |
| 2 | N.C. | A16 | |
| 3 | Vpp | A15 | * |
| 4 | A12 | A12 | |
| 5 | A7 | A7 | |
| 6 | A6 | A6 | |
| 7 | A5 | A5 | |
| 8 | A4 | A4 | |
| 9 | A3 | A3 | |
| 10 | A2 | A2 | |
| 11 | A1 | A1 | |
| 12 | A0 | A0 | |
| 13 | D0 | D0 | |
| 14 | D1 | D1 | |
| 15 | D2 | D2 | |
| 16 | GND | Vss | |
| 17 | D3 | D3 | |
| 18 | D4 | D4 | |
| 19 | D5 | D5 | |
| 20 | D6 | D6 | |
| 21 | D7 | D7 | |
| 22 | CE | CE | |
| 23 | A10 | A10 | |
| 24 | OE | OE | |
| 25 | A11 | A11 | |
| 26 | A9 | A9 | |
| 27 | A8 | A8 | |
| 28 | N.C. | A13 | |
| 29 | PGM | A14 | * |
| 30 | Vcc | A17 | * |
| 31 | N.C. | WE | |
| 32 | N.C. | Vcc | |

(N.C. = NO CONNECTION)

MULTIPLE USE CHIP SOCKET FOR INTEGRATED CIRCUITS AND THE LIKE

BACKGROUND OF THE INVENTION

1. Field Of The Invention

The present invention relates to the field of integrated circuits.

Specifically, the present invention relates to sockets for receiving integrated circuits and the like.

2. Description of Related Art

Many modern electronic circuit boards contain on-board read-only memory, typically provided as an erasable programmable read-only memory (EPROM). An EPROM provides permanent storage for configuration information or processing logic (i.e., firmware) that is used by the circuit board during normal operations or in a testing mode. One advantage of using an EPROM on a circuit board is that the operation of the circuit board can be customized without the need for jumpers, switches, or other hardware selection devices. Further, permanent memory storage is provided on the EPROM for storage of driver software used for controlling the operation of various resources or systems provided by the circuit board. The use of an EPROM device is convenient in that upgrades or enhancements to this driver software may be accomplished by replacing the EPROM device with a replacement containing the upgraded firmware. In this manner, the operation of a circuit board may be customized or upgraded.

One disadvantage in using a standard EPROM device for customizing a circuit board is that the EPROM must be removed from the board and replaced by another EPROM device containing the upgraded configuration information or firmware. Because the EPROM device must be removable, circuit board designers typically provide a socket into which an EPROM device may be removably inserted. In a conventional system, the socket pinouts are identical to the pinouts for the integrated circuit that is plugged into the socket. For that reason, conventional systems are limited to use of a single type read-only memory device for a given socket pinout configuration. Another disadvantage of conventional systems using EPROM devices is that the content of the EPROM devices cannot be modified without removing them from the circuit. The steps of removing an EPROM device and replacing the device with an upgraded EPROM requires field service support or user intervention. Sometimes errors are introduced in this process.

New non-volatile memory technology has given rise to new circuit board applications. Once such new technology is flash memory. Flash memory is a non-volatile memory technology wherein memory contents persist after power down; but, unlike an EPROM device, flash memory can be reprogrammed without removing the device from the circuit. Flash memory mitigates some of the limitations inherent in the use of EPROM devices. For example, configuration information or software resident within a flash device may be modified and permanently written into the flash device without removing the device from a circuit board. The problems inherent in removal and reinstallation of a modified EPROM device are thereby eliminated.

It is convenient in conventional systems to provide a means by which more than one type of read-only memory device may be installed in a socket on a circuit board. Having such a mechanism would allow a user to install either an EPROM device or a flash device into the same socket on a circuit board. In this manner, a particular circuit board could support either type of permanent storage device. However, the use of a single socket for multiple types of non-volatile memory devices is not provided in the prior art. Because the pinouts for an EPROM or other read-only memory device are different from the pinouts of a flash device, a single socket in conventional systems cannot support multiple types of permanent storage devices.

Thus, a better means and method is needed for allowing multiple types of permanent storage devices to be installed in a single socket on a circuit board.

SUMMARY OF THE INVENTION

The present invention is a multiple use chip socket providing a means and method by which more than one type of permanent storage chip may be supported in a single chip socket. The multiple use chip socket provides a plurality of address bit lines which are used to specify an address of a particular location within a memory device installed in the socket. In general, the number of address bit lines directly coupled to the socket correspond to the number of address bit lines required for the smallest memory device to be installed in the socket. Additional address bit lines are coupled to control logic of the present invention. As will be described in more detail below, the control logic selectively applies addressing signals to the chip socket depending on the type of memory device inserted in the socket.

As part of the initialization process, the processing logic of the present invention first determines if an access to a device installed in the chip socket is required by a circuit board as part of its initialization or boot process. If such an access is required, the processing logic of the present invention then determines if a device is installed in the chip socket. If a device is installed in the chip socket, the processing logic then determines if the device is a flash device or an EPROM device or other type of device. In this manner, the accessing signals appropriate for the particular type of device can be configured.

It is therefore an advantage of the present invention that a single socket supports both an EPROM device or a flash device. It is a further advantage of the present invention that a multiple use chip socket includes control logic for identifying the type of chip installed in the socket. It is a further advantage of the present invention that particular signals of the socket are manipulated depending on the type of chip installed within the socket. It is a further advantage of the present invention that particular address pins of the socket are provided only if a particular type of integrated circuit is installed within the socket. It is a further advantage of the present invention that power is provided to a particular pin of the socket only if a particular type of integrated circuit is installed in the socket. It is a further advantage of the present invention that control logic is provided for reading a predetermined location of a chip installed in the chip socket to determine if the chip is of a particular type.

These and other advantages of the present invention will become apparent as presented and described in the following detailed description of the preferred embodiment.

BRIEF DESCRIPTION OF THE DRAWINGS

FIG. 2 illustrates the pinouts of a typical EPROM device.

FIG. 3 illustrates the pinouts of a typical flash memory device.

FIG. 4 illustrates a comparison of the signals provided by a typical EPROM device and a typical flash memory device.

DETAILED DESCRIPTION OF THE PREFERRED EMBODIMENT

The present invention is a multiple use chip socket with control logic that supports multiple types of permanent storage devices. In the following description, numerous specific details are set forth in order to provide a thorough understanding of the present invention. However, it will be apparent to one of ordinary skill in the art that these specific details need not be used to practice the present invention. In other circumstances, well known structures, circuits, and interfaces have not been shown in detail in order not to unnecessarily obscure the present invention.

Figure 1:
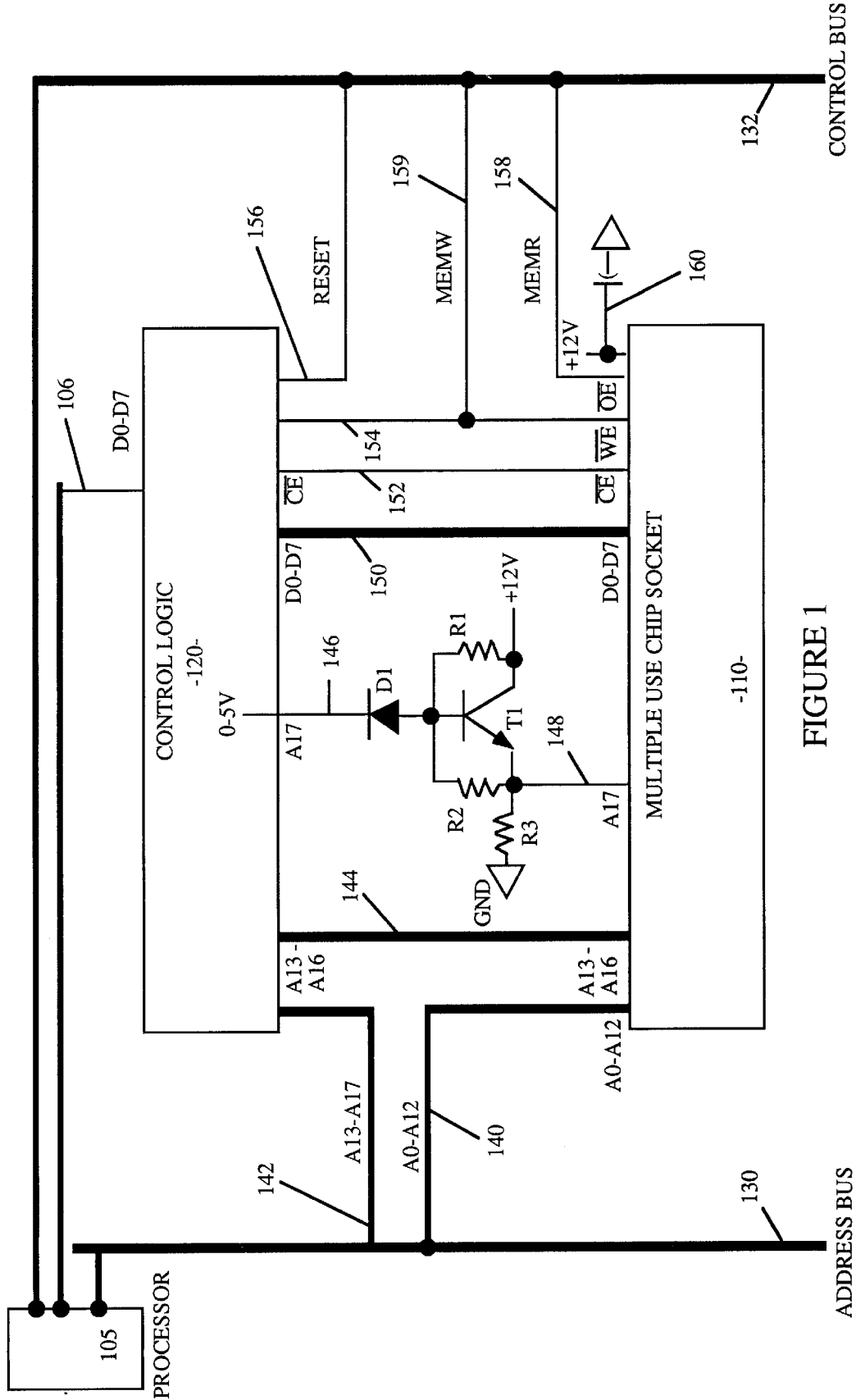
FIG. 1 illustrates the circuitry provided by the present invention.

Referring to FIG. 1, a block diagram of the multiple use chip socket 110 and the control logic 120 of the present invention is illustrated. Socket 110 comprises a conventional and well known integrated circuit chip socket. In the preferred embodiment, socket 110 is a 32 pin dual inline chip socket. Socket 110 includes pins which can be soldered directly to a circuit board or otherwise electrically connected to a circuit. Socket 110 includes conventional means for receiving a memory chip such as a conventional erasable programmable read-only memory (EPROM) device thereby providing a removable electrical coupling between an EPROM device and a circuit board to which socket 110 is connected. In the preferred embodiment, the EPROM device used is an 8K×8 bit memory device in a 28 pin dual inline package. Such devices are commonly available under the generic part designation 27C64. The pinouts for the EPROM device used in the preferred embodiment are illustrated in FIG. 2.

Referring now to FIG. 2, a chip socket is illustrated with socket pinouts corresponding to EPROM pinouts. Such is the case when an EPROM device is installed in socket 210. As illustrated in FIG. 2, pins 1 and 2 and pins 31 and 32 are not connected when an EPROM device is installed in socket 210. Because the EPROM device used in the preferred embodiment is a 28 pin device and socket 210 is a 32 pin device, pins 1, 2, 31, and 32 are not connected to an installed EPROM device. Pin 3 of socket 210 with an EPROM device installed is a $V_{pp}$ pin by which power is supplied to the EPROM device installed within socket 210. Socket 210 pin 4 is the twelfth address bit line A12.

Similarly, socket 210 pins 5–12 comprise address bit lines A7–A0, respectively. Pins 13, 14, and 15 of socket 210 represent the first three data bits D0–D2. Pin 16 of socket 210 with an EPROM device installed is a ground pin GND. Pin 30 of socket 210 is another power pin $V_{cc}$. Pin 29 of socket 210 is a program ($\overline{PGM}$) pin used to program the contents of an EPROM device in a separate PROM programming system. In general, the $\overline{PGM}$ pin is not asserted while an EPROM device is installed in an application circuit board. Pin 28 of socket 210 is not connected for a 27C64 type EPROM device as used in the preferred embodiment. Pins 25–27 of socket 210 represent the eleventh, ninth and eighth address bit lines (A11, A9, and A8) provided to an EPROM device installed in socket 210. Pin 24 of socket 210 is the output enable ($\overline{OE}$) control line which is provided as an input to the EPROM device on a memory read cycle. Pin 23 of socket 210 is the tenth address bit line A10 of the address provided to the EPROM device. Pin 22 of socket 210 is the chip enable ($\overline{CE}$) control line which enables the output of data from the EPROM device installed in socket 210. Socket pins 17–21 of socket 210 comprise data bit lines 3–7 (D3–D7), respectively. The use of an EPROM device with the pinouts as illustrated in FIG. 2, is well known to those of ordinary skill in the art.

Referring again to FIG. 1, multiple use chip socket 110 is shown as coupled with several signal lines and groupings of signal lines. Referring to the left side of FIG. 1, an address bus 130 provides a plurality of address bit lines which are used to specify an address of a particular location within a memory device installed in socket 110. In a typical application, the multiple use chip socket 110 is coupled to an address bus 130 and a control bus 132. The address bus 130 and the control bus 132 is coupled to a processor 105. Processor 105 is also coupled to a data bus 106. The processor 105 issues memory access requests on the address bus 130 and the control bus 132 which are destined for a memory device or other device installed in the multiple use chip socket 110.

In the preferred embodiment, address bus 130 provides at least 18 address bit lines (A0–A17). It will be apparent to one of ordinary skill in the art that a greater or lesser number of address bit lines may be provided on address bus 130. Address bit lines A0–A12 on lines 140 are directly coupled to socket 110. Address bit lines 140 correspond to address bit lines A0–A12 illustrated for socket 210 in FIG. 2. In general, the number of address bit lines directly coupled to socket 110 correspond to the number of address bit lines required for the smallest memory device to be installed in socket 110. Additional address bit lines A13–A17 on lines 142 are coupled to control logic 120. As will be described in more detail below, control logic 120 selectively applies address signals A13–A17 to chip socket 110 depending on the type of memory device inserted in socket 110.

Multiple use chip socket 110 transfers data on data lines D0–D7 150. Data lines D0–D7 correspond to socket pins 13–15 and 17–21 as illustrated in FIG. 2. Chip socket 110 also receives a chip enable ($\overline{CE}$) signal used for enabling access to a memory device installed within socket 110. The chip enable ($\overline{CE}$) signal on line 152 corresponds to the signal received on socket pin 22 as illustrated in FIG. 2. Socket 110 also receives an output enable ($\overline{OE}$) signal which is used to control a memory read cycle from a memory device installed in socket 110. The $\overline{OE}$ signal corresponds to socket pin 24 as illustrated in FIG. 2. The $\overline{OE}$ is provided as a memory read (MEMR) signal on line 158 which is coupled to control bus 132 as illustrated in FIG. 1. The use of a memory read signal as controlling an output enable signal of a memory device is well known to those of ordinary skill in the art. Each of these signals described above (i.e., A0–A12, D0–D7, $\overline{CE}$, and $\overline{OE}$) are used to interface with and control an EPROM device installed within chip socket 110. In the preferred embodiment, the intended EPROM device for use in the chip socket is an 8K×8 bit EPROM device.

Conventional systems dedicate a chip socket to a particular configuration of signals as defined by a particular type of integrated circuit which is intended to be inserted into the socket. The present invention is advantageous in that multiple types of integrated circuits (with different pinouts) may be inserted into chip socket 110. For example, a flash memory device may be installed in chip socket 110 and supported by the signal lines illustrated in FIG. 1. One such flash memory device is manufactured by Intel Corporation under the part designation P28F020. This flash device is a 32 pin dual inline package comprising a 256K×8 bit flash memory device. The pinouts for this flash memory device are illustrated in FIG. 3.

Referring now to FIG. 3, the pinouts for a chip socket 310 in which a flash memory device is installed is illustrated.

Unlike the EPROM device described above, the 32 pin flash device uses all of the available socket 310 pins. The signals on the pins of a flash configured chip socket 310 comprises a power pin ($V_{pp}$) on socket pin 1 in the preferred embodiment. Socket pins 2 and 3 comprise address bit lines A16 and A15, respectively. Socket pin 4 corresponds to address bit line A12. Socket pins 5–12 correspond to address bit lines A7–A0, respectively. Socket pins 13–15 represent data bits D0–D2. Socket pin 16 is a ground pin denoted $V_{SS}$. Socket pins 17–21 correspond to data bit lines D3–D7. Socket pin 22 is a chip enable ($\overline{CE}$) signal. Socket pin 23 corresponds to address bit line A10. Socket pin 24 corresponds to the output enable ($\overline{OE}$) signal which is used to control a memory read cycle from the flash device installed in socket 110. Socket pins 25–30 correspond to address bit lines A11, A9, A8, A13, A14, and A17. Socket pin 31 is a write enable ($\overline{WE}$) signal used during a memory write cycle. Unlike an EPROM device, a flash memory device may be write modified while the device is still in circuit. Thus, the write enable signal may be activated or deactivated during the normal operation of the flash device installed in socket 310. Finally, pin 32 of socket 310 is another power pin $V_{cc}$. The manipulation of these signals for a standard flash device are well known to those of ordinary skill in the art.

Figure 5:
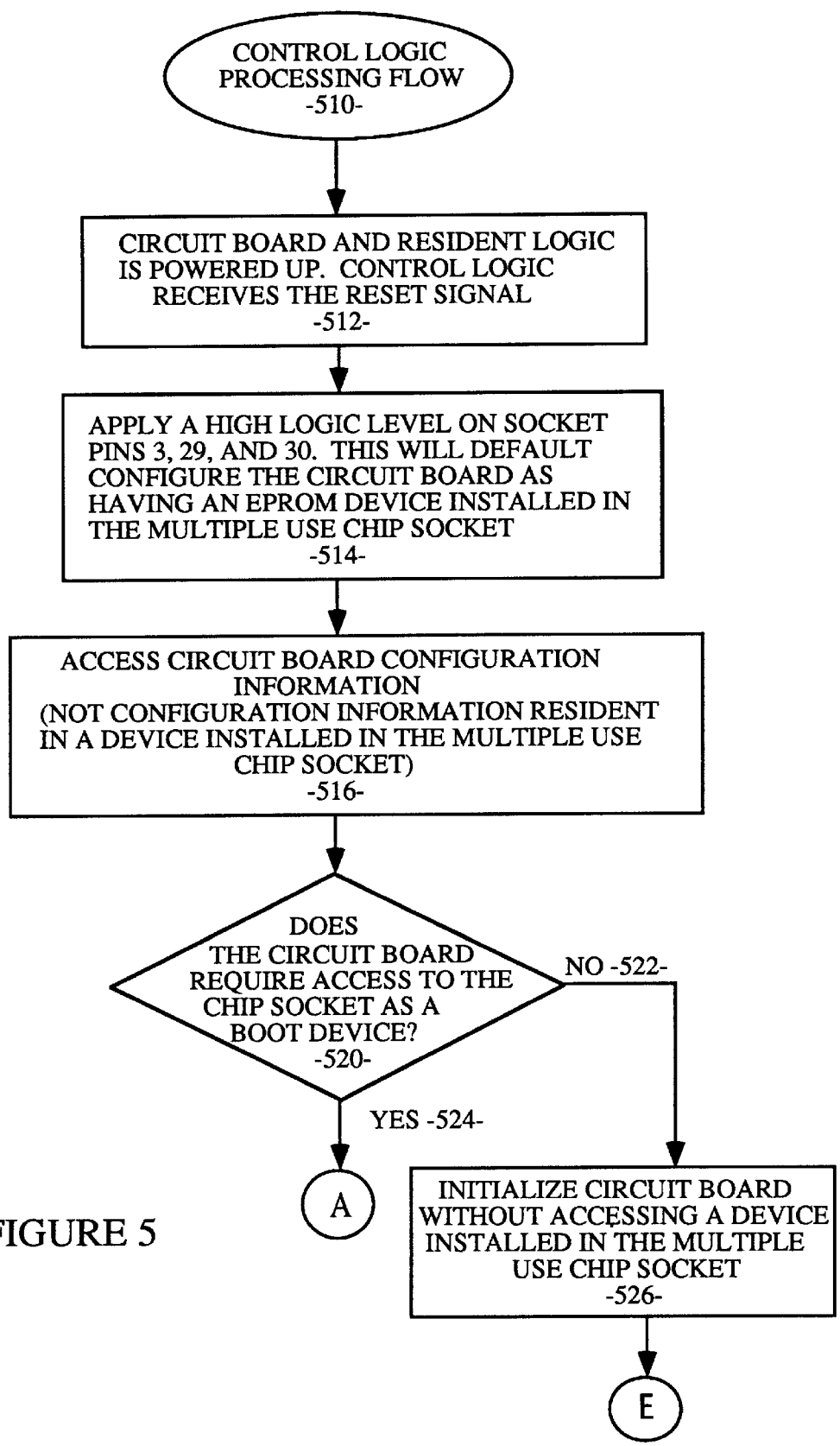
FIGS. 5–7 are flow diagrams illustrating the processing flow used in the present invention.
Figure 6:
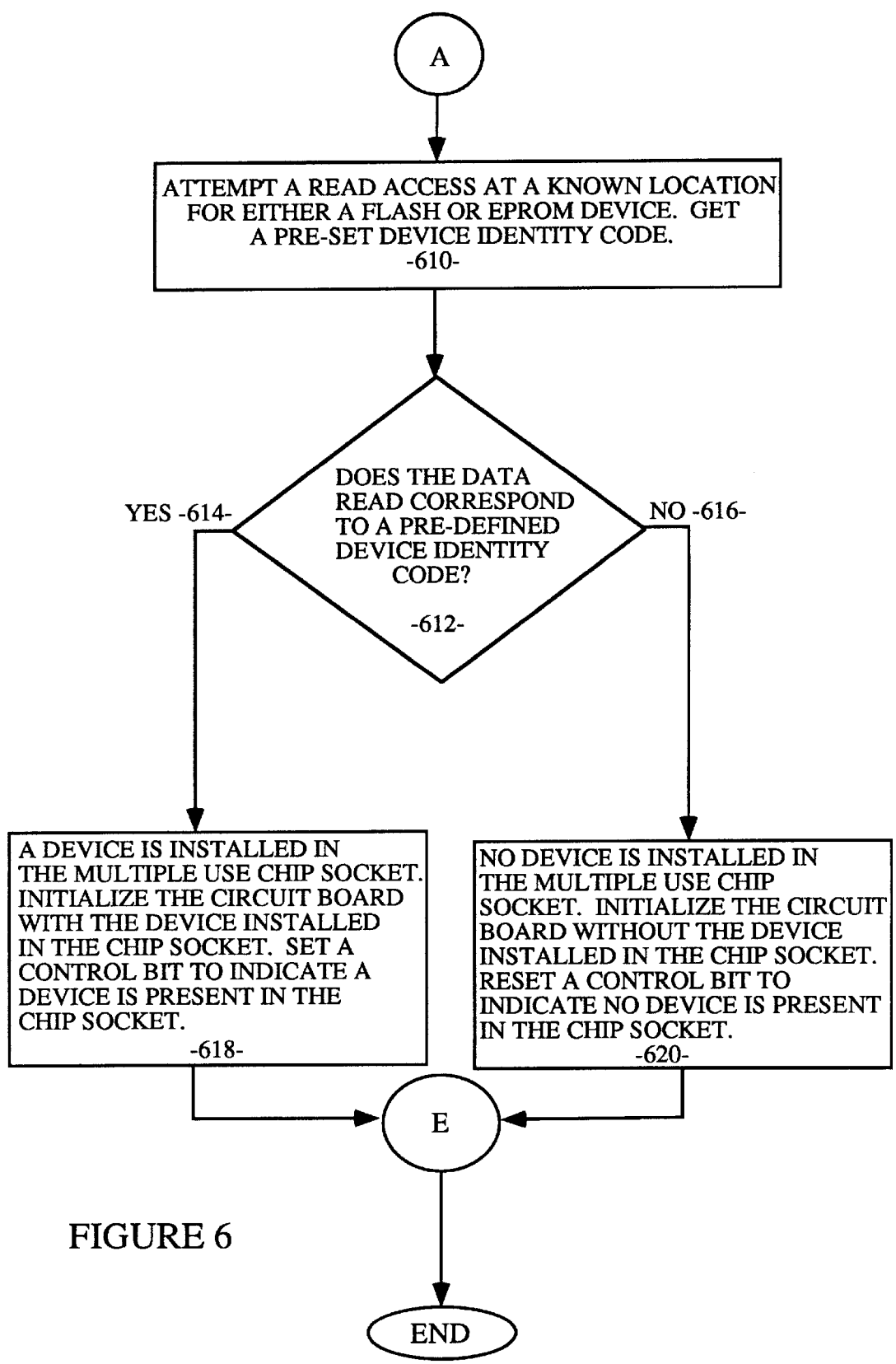
Figure 7:
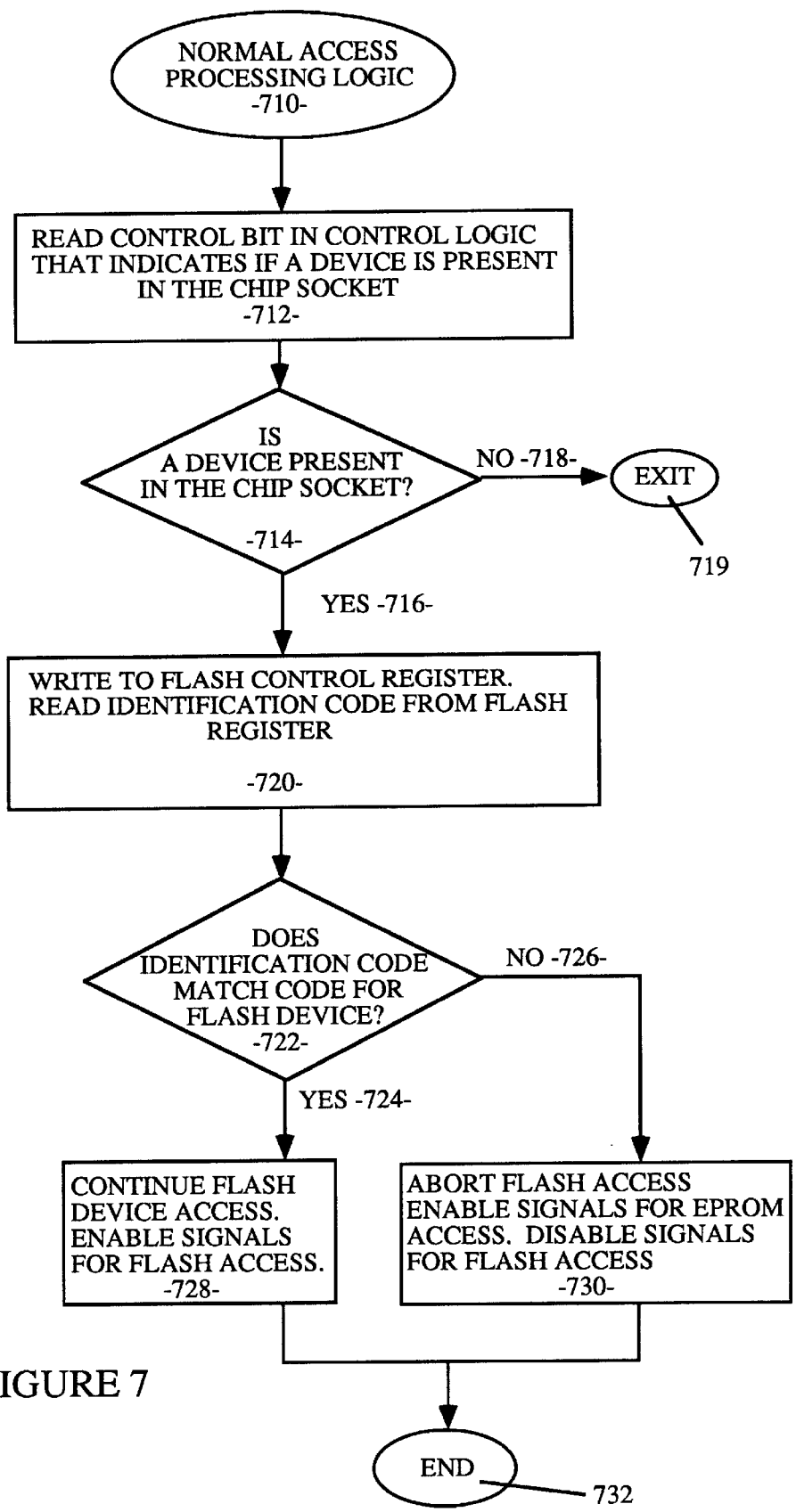

Referring now to FIG. 4, a comparison of the signals of a typical ROM device and a typical flash memory device is illustrated. For each of the 32 socket pins provided in the multiple use socket of the preferred embodiment, the corresponding signal of an EPROM device and a flash memory device is illustrated. For example, socket pin 1 is not connected if an EPROM device is installed in the multiple use chip socket of the present invention. If a flash memory device is installed in the multiple use chip socket, socket pin 1 represents $V_{pp}$. Similarly, socket pin 3 represents $V_{pp}$ when an EPROM device is installed in the multiple use chip socket. However, socket pin 3 represents address bit line A15 when a flash memory device is installed in the multiple use chip socket. As indicated for each of the socket pins with either an EPROM device or a flash memory device installed in the socket, most of the signals between the two devices are identical. In the case of socket pins 1, 2, 28, 31, and 32, the pins are only connected to a circuit in the case where a flash memory device is installed in the socket. For three socket pins however, signals provided for an EPROM device are incompatible or different from the signals provided for the installation of a flash memory device. These three signals require special processing performed by control logic 120 as part of the present invention. As indicated in FIG. 4, the three signals requiring special processing are present on socket pins 3, 29, and 30 in the preferred embodiment. Socket pin 3 for an installed EPROM device represents a power pin $V_{pp}$. However for an installed flash memory device, socket pin 3 represents address bit A15. Socket pin 29 for an installed EPROM device represents the program ($\overline{PGM}$) signal used for programming the EPROM device. For a flash device, socket pin 29 represents address bit A14. Socket pin 30 in an EPROM configuration represents power pin $V_{cc}$. In a flash configuration, socket pin 30 represents address bit A17. These three signals requiring special processing as well as the signals that are provided only in the case of a flash memory device and not connected for an EPROM device, are selectively manipulated by the present invention in order to support a multiple use functionality in multiple use chip socket 110. The structure supporting this manipulation is illustrated in FIG. 1 and the processing logic performed to carry out this manipulation is illustrated in the flowcharts of FIGS. 5–7.

Referring again to FIG. 1, control logic 120 receives higher order address bit lines A13–A17 on lines 142. Because an EPROM device installed in chip socket 110 can only use address bit lines A0–A12, address bit lines of a higher order than address bit line A12 cannot be directly coupled from address bus 130 to chip socket 110. For this reason, higher order address bit lines A13–A17 are directly coupled to control logic 120. Under control of the processing logic of control logic 120 as described below, address bit lines A13–A16 are selectively provided to chip socket 110 on lines 144. Addressing signals are only provided on address bit lines A13–A16 on lines 144 when a flash memory device is installed in chip socket 110. In other cases, the addressing signals on line 144 are held inactive or held in a tri-state condition in order to prevent these signals from interrupting with the operation of an EPROM device installed in chip socket 110. In the case of address bit lines A14 and A15, special processing is required. For these bit lines (i.e., A14 and A15), a high logic level must be maintained on these pins for a socket in which an EPROM device is installed. Because the flash memory address bit line A14 corresponds to the EPROM device $\overline{PGM}$ pin (i.e., socket pin 29), the logic level on this socket pin must be maintained at a high logic level when an EPROM device is installed in order to prevent the EPROM device from entering a programming mode. The flash memory address bit line A15 corresponds to the power pin $V_{pp}$ (i.e., socket pin 3). Thus, a high logic level must be provided to socket pin 3 when an EPROM device is installed in order to properly provide power to the EPROM device. For these reasons, the processing logic of control logic 120 as described in FIGS. 5–7 performs special processing in order to ensure that high logic levels are maintained on socket pins 3 and 29.

Address bit line A17 is coupled to chip socket 110 through line 146, diode D1, the emitter portion of transistor T1, and line 148. Pull-up resistor R1 is coupled between the base of transistor T1 and the collector of transistor T1 as coupled to a 12 volt power source. Pull-down resistor R2 is coupled between the base of transistor T1 and the emitter of transistor T1 as coupled to a ground region through resistor R3. Transistor T1 is any one of a commonly available and well known NPN bipolar transistor type which is well known to those of ordinary skill in the art. Similarly, diode D1 is any one of a type of commonly available diodes. The transistor/resistor network illustrated in FIG. 1 represents an emitter follower circuit wherein a signal from control logic 120 on line 146 is used to selectively couple or decouple a power source of the collector of transistor T1 with the address bit line A17 of chip socket 110 on line 148. Because the voltage level provided at address bit line A17 of chip socket 110 can typically be no more than 5 volts, diode D1 is used to provide a bias voltage for transistor T1 which causes a selectively appropriate 5 volt signal to be supplied on line 148 and address bit line A17 of chip socket 110. Because address bit line A17 of a flash memory device corresponds to the power pin $V_{cc}$ of an EPROM device (socket pin 30), the emitter follower circuit illustrated in FIG. 1 is necessary to provide an appropriate voltage and current on socket pin 30 when an EPROM device is installed. In a typical case, the current provided at socket pin 30 for an EPROM device is approximately 30 milliamps. When a flash device is installed in chip socket 110, address bit line A17 is driven by control logic 120 as an ordinary high order bit line of a flash memory device. However, when an EPROM device is installed in chip socket 110, control logic 120 maintains a high logic level on line 146 thereby triggering transistor T1 to provide a $V_{cc}$ power source for the EPROM device on line 148. Thus, control logic 120 selectively supports address bit line A17 for a flash device and the power pin $V_{cc}$ for an EPROM device installed in chip socket 110.

Referring still to FIG. 1, a chip enable signal ($\overline{CE}$) is provided from control logic 120 directly to chip socket 110 on line 152. The chip enable signal is used to enable operation of either a flash memory device or an EPROM device installed in chip socket 110. As illustrated in FIGS. 2–4, the chip enable signal appears at the same socket pin for both a flash memory device and an EPROM device. The manipulation of a chip enable signal for either an EPROM device or a flash memory device is well known to those of ordinary skill in the art.

A reset signal is coupled from control bus 132 to control logic 120 on line 156. The reset signal is used to trigger initialization of the logic within control logic 120 as described in the flowcharts of FIGS. 5–7. The generation of a reset signal is well known to those of ordinary skill in the art.

Standard signals provided on control bus 132 are used to control a memory read or a memory write operation of a device installed in chip socket 110. The memory read signal (MEMR) is provided from control bus 132 on line 158. The memory read signal is coupled to the output enable ($\overline{OE}$) pin 24 of socket 110. The output enable signal ($\overline{OE}$) is provided on the same pin for both an EPROM device and a flash device. The manipulation of the output enable signal and the memory read signal are well known to those of ordinary skill in the art. A 12 volt power source is also coupled to chip socket 110 on line 160.

A memory write signal (MEMW) signal is also provided on control bus 132. The memory write signal is used to control the operation of writing data into a device installed in chip socket 110. Because an EPROM device cannot be written in this way, the memory write signal provided on line 159 from control bus 132 is only usable in the case when a flash memory device is installed in chip socket 110. In this case, the memory write signal is coupled to the write enable ($\overline{WE}$) signal pin 31 of socket 110. Similarly, the memory write signal is coupled to control logic 120 on line 154. Control logic 120 selectively enables operation of the write enable signal only in the case when a flash memory device is installed in chip socket 110.

Referring now to FIGS. 5–7, the processing steps performed by control logic 120 for controlling the operation of signals of chip socket 110 is illustrated starting at bubble 510. The processing logic illustrated in FIGS. 5 and 6 is executed on power up initialization of control logic 120. The processing logic illustrated in FIG. 7 is executed during normal execution of an access to the device installed in socket 110.

Referring to FIG. 5, when a circuit board containing chip socket 110 is first powered up, a reset signal is applied to control logic 120 on line 156 from control bus 132 (processing block 512). Upon receipt of the active reset signal, control logic 120 applies a high logic level on socket pins 3, 29, and 30. These pins are those that require special processing as listed in FIG. 4. The action of applying a high logic level to these three pins will default configure the circuit board containing the multiple use chip socket as having an EPROM device installed therein. On reset, control logic 120 is not yet aware of the type of device installed in chip socket 110, nor whether a device is even installed in socket 110. For this reason, control logic 120 assumes on reset that an EPROM device is installed in chip socket 110. In this manner, the device installed in chip socket 110, if any, and the information contained within the device installed in chip socket 110 is protected from damage while the initialization process of control logic 120 is performed.

In the preferred embodiment of the present invention, the processing logic of control logic 120 then executes processing block 516. In this processing block, control logic 120 accesses configuration information stored in a memory device or register different from the device installed in chip socket 110. This other configuration information can be used to define whether or not a device installed in socket 110 is used by the circuit board as a boot device. For example, a particular bit pattern in this other configuration information may correspond to a mode where the circuit board is required to access a device in socket 110 as a boot device. Similarly, a different bit pattern may define a mode where the circuit board is not required to access a device in socket 110 as a boot device.

Having accessed this other information, control logic 120 can determine whether the circuit board is required to access the device installed in socket 110 as a boot device. If the circuit board is required to access the device installed in socket 110 as a boot device, processing path 524 is taken to the bubble labeled "A" illustrated n FIG. 6. If, however, the circuit board is not required to access the device installed in socket 110 as a boot device, processing path 522 is taken to processing block 526 where the circuit board containing chip socket 110 is initialized without the use of a device installed in chip socket 110. Control logic 120 processing then terminates through the bubble labeled "E" illustrated in FIG. 6. It will be apparent to those of ordinary skill in the art that this other configuration information can be stored in another memory device or register installed elsewhere on the circuit board.

Referring now to FIG. 6, processing performed by control logic 120 continues at the bubble labeled "A". In this case, it is known that the circuit board must access a device in socket 110 as a boot device; however, it is not known if a device is actually installed in chip socket 110. It is also not known whether the device so installed is an EPROM device or a flash memory device. In order to determine if a device is installed in socket 110, a read access is attempted to a predetermined location that exists in either a flash device or an EPROM device that may be installed in socket 110. In a conventional manner, this location in the device so installed is loaded with a pre-defined bit pattern that corresponds to a device identity code. The predefined device identity code defines a particular bit pattern corresponding to the presence of a device installed in chip socket 110. In an alternative embodiment, this device identity code can be used to define the presence of a particular type of device such as a flash or EPROM device installed in socket 110. This identity code will not exist if no device is installed in chip socket 110. As control logic 120 attempts to read the predefined device identity code from the pre-defined location, processing path 614 is taken if the identity code so read corresponds to the correct predefined device identity code. In this case, a device (flash or EPROM) is known to exist in the socket 110. If, however, the identity code does not correspond to the correct device identity code, processing path 616 is taken to handle the case where no device is installed in chip socket 110.

Processing block 618 is executed if a memory device (flash or EPROM) is installed in chip socket 110. In this case, the circuit board is initialized by accessing the boot device installed in socket 110. Also, a control bit is set in control logic 120 that indicates that a memory device is present in socket 110. Initialization processing of control logic 120 then terminates through the bubble labeled "E" illustrated in FIG. 6. Processing block 620 is executed if no device is installed in chip socket 110. In this case, the circuit board is initialized without accessing the boot device installed in socket 110. Also, the control bit in control logic 120 that indicates that a memory device is present in socket 110 is reset to indicate no device present. Initialization processing of control logic 120 then terminates through the bubble labeled "E" illustrated in FIG. 6.

Referring now to FIG. 7, processing logic is illustrated for a normal access (i.e. non-initialization access) to a device installed in socket 110 starting at bubble 710. First, the processing logic reads the control bit set or reset during initialization as described above in relation to FIG. 6. This control bit defines whether or not a device is installed in chip socket 110. If the control bit specifies that a device is installed in socket 110, processing path 716 is taken to processing block 720. If, however, the control bit specifies that a device is not installed in socket 110, processing path 718 is taken to the Exit bubble 719 where the normal access terminates in an error condition.

Referring to processing block 720, a device has been found to be installed in chip socket 110. However, at this point, it is not known whether the device so installed is an EPROM device or a flash memory device. In order to make this distinction, a read access is attempted to a predetermined register in a flash memory device installed in chip socket 110 (processing block 720). In a manner well known to those of ordinary skill in the art, a flash device register can be predefined in a flash device at a predetermined address in flash memory. A predefined flash device identity code is stored in the flash device register. The predefined flash device identity code defines a particular bit pattern corresponding to the presence of a flash device installed in chip socket 110. This identity code will not exist if an EPROM device is installed in chip socket 110. In order to read this flash register, a write access must first be made to a flash control register in a manner well known in the art. Once this write access is completed, the flash device register may be read. As control logic 120 attempts to read the predefined flash device identity code from the flash device register (processing block 720), processing path 724 is taken if the identity code so read corresponds to the correct predefined flash device identity code. If, however, the identity code does not correspond to the flash device identity code, processing path 726 is taken to handle the case where an EPROM device is installed in chip socket 110. Processing block 728 is executed if a flash memory device is installed in chip socket 110. In this case, the address bit lines A13–A17 are enabled for normal high/low addressing transitions as defined by address bus 130. Similarly, the write enable signal ($\overline{\text{WE}}$) is enabled for normal high/low transitions as defined by control bus 132. Processing of control logic 120 then terminates through the End bubble 732 as illustrated in FIG. 7.

Processing block 730 is executed if an EPROM device is installed in chip socket 110. In this case, active signals on address bit lines A13–A17 are disabled. Except for the signals requiring special processing, the disabled addressing signals can be held at a deasserted logic level or tri-stated depending on the requirements of a particular circuit board. In any case, these addressing signals are prevented from interrupting the operation of the EPROM device installed in socket 110. Similarly, the write enable signal ($\overline{\text{WE}}$) is disabled from active operation by being deasserted or tri-stated. For an EPROM device, the signals requiring special processing (i.e., pins 3, 29, and 30) are held at a high logic level by control logic 120 in order to support the signal requirements of an EPROM device installed in chip socket 110. Processing of control logic 120 then terminates through the End bubble 732 as illustrated in FIG. 7.

It will be apparent to those of ordinary skill in the art that control logic 120 may be implemented as an ASIC device, or a microprogrammed device as well known in the art. Further, it will be apparent to those of ordinary skill in the art that the memory device installed in multiple use chip socket 110 is typically a boot ROM device used for storage of operating system logic or a basic input/output operating system (BIOS).

Thus, a multiple use chip socket with control logic supporting multiple types of permanent storage devices is disclosed. Although the present invention is described herein with reference to a specific embodiment, many modifications and variations therein will readily occur to those of ordinary skill in the art. Accordingly, all such variations and modifications are included within the intended scope of the present invention as defined by the following claims.

What is claimed is:

1. A multiple use chip socket comprising:
    a chip socket for receiving either a first chip type or a second chip type, said first chip type having a first set of signals, said second chip type having a second set of signals different from said first set of signals; and
    control logic coupled to said chip socket for determining whether a chip of said first chip type or said second chip type is installed in said chip socket by reading a predetermined memory location of a chip installed in said chip socket and for providing signals to said chip socket compatible with either said first set of signals or said second set of signals to configure said chip socket to support operation of either said first chip type or said second chip type installed in said chip socket.

2. The multiple use chip socket as claimed in claim 1 wherein said first chip type is an EPROM chip type and said second chip type is a flash memory chip type.

3. The multiple use chip socket as claimed in claim 1 wherein said control logic further includes logic for selectively providing to a particular pin of said socket either a Vcc voltage if a chip of said first chip type is installed in said chip socket or an address signal if a chip of said second chip type is installed in said chip socket.

4. The multiple use chip socket as claimed in claim 1 wherein said control logic further includes logic for selectively holding a fixed logic level on a particular pin of said socket if a chip of said first chip type is installed in said chip socket or providing an address signal to said particular pin of said socket if a chip of said second chip type is installed in said chip socket.

5. The multiple use chip socket as claimed in claim 1 wherein said control logic further includes logic for determining whether or not a device is installed in said chip socket.

6. The multiple use chip socket as claimed in claim 1, wherein said control logic further comprises logic for determining if said chip installed in said multiple use chip socket is required to be accessed as a boot device.

7. The multiple use chip socket as claimed in claim 1, wherein said first chip type and said second chip type are memory chips, and wherein operation of said first chip type and said second chip type includes a memory read operation or a memory write operation.

8. A computer system comprising:
    an address bus and a control bus;

a processor coupled to said address bus and said control bus for transferring a memory access request to a memory chip; and a multiple use chip socket coupled to said address bus and said control bus, said multiple use chip socket further including:

a.) a chip socket for receiving either a first chip type or a second chip type, said first chip type having a first set of signals, said second chip type having a second set of signals different from said first set of signals; and b.) control logic coupled to said chip socket for determining whether a chip of said first chip type or said second chip type is installed in said chip socket and for providing signals to said chip socket compatible with either said first set of signals or said second set of signals to configure said chip socket to support operation of either said first chip type or said second chip type installed in said chip socket, said control logic including logic for reading a predetermined memory location of a chip installed in said chip socket to determine whether a chip of said first chip type or said second chip type is installed in said chip socket.

9. The computer system as claimed in claim 8 wherein said first chip type is an EPROM chip type and said second chip type is a flash memory chip type.

10. The computer system as claimed in claim 8 wherein said control logic further includes logic for selectively providing to a particular pin of said socket either a Vcc voltage if a chip of said first chip type is installed in said chip socket or an address signal if a chip of said second chip type is installed in said chip socket.

11. The computer system as claimed in claim 8 wherein said control logic further includes logic for selectively holding a fixed logic level on a particular pin of said socket if a chip of said first chip type is installed in said chip socket or providing an address signal to said particular pin of said socket if a chip of said second chip type is installed in said chip socket.

12. The computer system as claimed in claim 8 wherein said control logic further includes logic for determining whether or not a device is installed in said chip socket.

13. The multiple use chip socket as claimed in claim 8, wherein said control logic further comprises logic for determining if said chip installed in said multiple use chip socket is required to be accessed as a boot device.

14. A method for accessing a chip installed in a multiple use chip socket, said method comprising the steps of:

determining if said chip installed in said multiple use chip socket is required to be accessed as a boot device;

determining if a chip is installed in said multiple use chip socket;

determining if said chip installed in said multiple use chip socket is a chip of either a first chip type or a second chip type by reading a predetermined location of said chip installed in said chip socket, said first chip type having a first set of signals, said second chip type having a second set of signals different from said first set of signals; and configuring accessing signals appropriate for either said first chip type or said second chip type depending on which type of chip is determined in said step of determining if said chip installed in said multiple use chip socket is a chip of either a first chip type or a second chip type.

15. The method as claimed in claim 14 wherein said first chip type is an EPROM chip type and said second chip type is a flash memory chip type.

16. The method as claimed in claim 14 further including the steps of:

providing a $V_{cc}$ voltage to a particular pin of said socket if a chip of said first chip type is installed in said socket; and providing an address signal to said particular pin of said socket if a chip of said second chip type is installed in said socket.

17. The method as claimed in claim 14 further including the steps of:

holding a fixed logic level on a particular pin of said socket if a chip of said first chip type is installed in said socket; and providing an address signal to said particular pin of said socket if a chip of said second chip type is installed in said socket.

18. A multiple use chip socket comprising:

a chip socket for receiving an EPROM chip or a flash memory chip, said EPROM chip having a first set of signals, said flash memory chip having a second set of signals different from said first set of signals; and control logic coupled to said chip socket for determining whether said EPROM chip or said flash memory chip is installed in said chip socket by reading a predetermined location of said EPROM chip or said flash chip installed in said chip socket and for providing signals to said chip socket compatible with either said EPROM chip or said flash memory chip such that memory read and memory write operations can be performed upon whichever of said EPROM chip or said flash memory chip is installed in said chip socket.

* * * * *